United States Patent
Kouno et al.

(10) Patent No.: US 7,924,627 B2
(45) Date of Patent: Apr. 12, 2011

(54) SEMICONDUCTOR MEMORY DEVICE

(75) Inventors: Kazuyuki Kouno, Osaka (JP);
Hoshihide Haruyama, Kyoto (JP);
Masayoshi Nakayama, Shiga (JP); Reiji Mochida, Osaka (JP)

(73) Assignee: Panasonic Corporation, Osaka (JP)

( * ) Notice: Subject to any disclaimer, the term of this patent is extended or adjusted under 35 U.S.C. 154(b) by 162 days.

(21) Appl. No.: 12/488,867

(22) Filed: Jun. 22, 2009

(65) Prior Publication Data

US 2010/0027366 A1 Feb. 4, 2010

(30) Foreign Application Priority Data

Jul. 31, 2008 (JP) .................................. 2008-198643
Mar. 27, 2009 (JP) .................................. 2009-079490

(51) Int. Cl.
*G11C 11/34* (2006.01)
*G11C 16/06* (2006.01)
(52) U.S. Cl. .................. 365/185.25; 365/204
(58) Field of Classification Search .............. 365/185.25, 365/204, 185.16
See application file for complete search history.

(56) References Cited

U.S. PATENT DOCUMENTS

| | | | |
|---|---|---|---|
| 5,229,963 A | 7/1993 | Ohtsuka et al. | |
| 6,301,158 B1 | 10/2001 | Iwahashi | |
| 6,487,124 B2 * | 11/2002 | Semi | 365/185.25 |
| 6,909,639 B2 * | 6/2005 | Park et al. | 365/185.25 |
| 7,405,978 B2 * | 7/2008 | Hahn et al. | 365/185.25 |
| 2004/0184318 A1 | 9/2004 | Morikawa | |

FOREIGN PATENT DOCUMENTS

JP 2007-128583 5/2007

* cited by examiner

*Primary Examiner* — Anh Phung
(74) *Attorney, Agent, or Firm* — McDermott Will & Emery LLP

(57) ABSTRACT

In a semiconductor memory device, a voltage rise due to IR-DROP is suppressed which occurs when a ground voltage is applied to a memory cell during a program operation. Discharge transistors are provided between the ground and bit lines connected to the source and drain of the memory cell. The discharge transistors receive mutually independent discharge control signals which are generated and outputted from a DS decoder driver at the respective gates thereof. To the bit line which applies the ground voltage to the memory cell, the ground voltage can be set using the discharge transistor.

6 Claims, 6 Drawing Sheets

FIG. 3
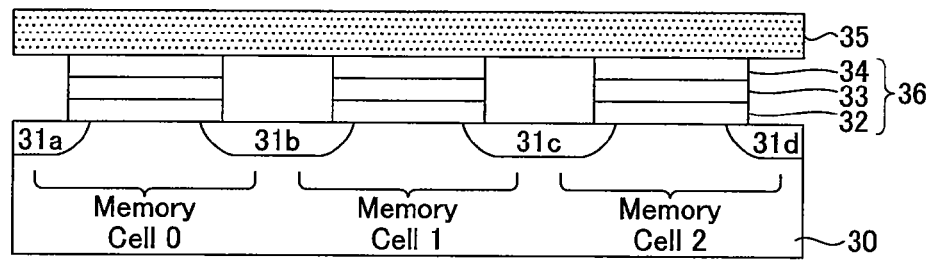
FIG. 4A
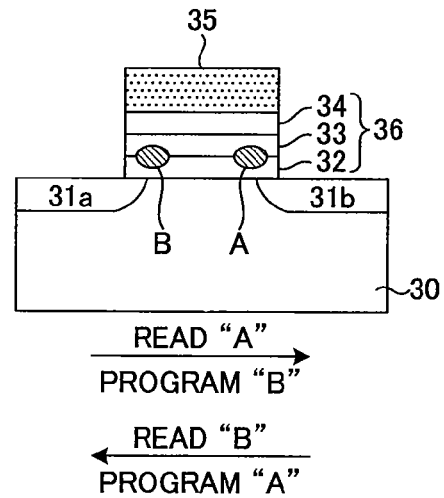
FIG. 4B
| Bit | Mode | Gate(35) | Drain(31a) | Source(31b) | Cell Current |
|---|---|---|---|---|---|
| A | READ | 5V | 1.5V | 0V | 10-20μA |
| | PROGRAM | 9V | 0V | 3-6V | 100-200μA |
| B | READ | 5V | 0V | 1.5V | 10-20μA |
| | PROGRAM | 9V | 3-6V | 0V | 100-200μA |

SEMICONDUCTOR MEMORY DEVICE

CROSS-REFERENCE TO RELATED APPLICATION

This application claims priority under 35 U.S.C. §119(a) on Japanese Patent Application No. 2008-198643 filed on Jul. 31, 2008, and No. 2009-79490 filed on Mar. 27, 2009, the entire contents of which are hereby incorporated by reference.

BACKGROUND

The present disclosure relates to a semiconductor memory device and, more particularly, to a circuit technology for solving a problem which occurs when a ground voltage is applied to a memory cell during a program operation.

In recent years, with growing demand for electronic equipment, particularly mobile phones, mobile music players, digital cameras, and the like, demand for semiconductor devices, particularly flash memories has grown. As a result, vigorous technological development has been undertaken to achieve a larger capacity, a smaller size, a higher-speed program, and a higher-speed read operation.

As a technology for implementing a larger-capacity flash memory, there has been a multi-level technique for a memory cell. According to the multi-level technique, data of 2 bits or more is stored in a memory cell. To implement the multi-level technique, a flash memory using a MONOS memory cell (NROM) has been vigorously developed in recent years. The MONOS flash memory implements multi-level data storage by storing data at physically different two locations in a memory cell, and is used as a flash memory for, e.g., storing the code program of electronic equipment.

A program operation in the MONOS flash memory is performed by applying a positive high voltage of about 9 V to the gate of a memory cell, applying a positive high voltage of about 3 to 6 V to the drain thereof, and applying a ground voltage of 0 V to the source thereof. The program operation in the MONOS flash memory is performed through a CHE (Channel Hot Electron) operation, and a cell current during the program operation has a value as large as about 100 to 200 µA.

FIG. 8 is a view showing a current path during a program operation in a conventional MONOS flash memory. In FIG. 8, a memory cell MC has a gate connected to a word line WL0, a drain connected to a sub-bit line SBL1, and a source connected to a sub-bit line SBL0. The sub-bit lines SBL0 and SBL1 are connected respectively to main bit lines MBL0 and MBL1 via selection transistors S0 and S1. To the respective gates of the selection transistors S0 and S1, selection transistor control signals SL0 and SL1 are given. During the program operation to a memory cell MC, the selection transistor control signals SL0 and SL1 are each in a selected state, while the sub-bit lines SBL0 and SBL1 and the main bit lines MBL0 and MBL1 are each in a connected state.

The main bit lines MBL0 and MBL1 are connected respectively to first column transistors C0 and C1. To the respective gates of the first column transistors C0 and C1, first column transistor control signals CS0 and CS1 are given. During the program operation to the memory cell MC, the first column transistor selection signals CS0 and CS1 are each in the selected state. The first column transistors C0 and C1 are connected respectively to second column transistors B0 and B1. To each of the respective gates of the second column transistors B0 and B1, a second column transistor control signal BS0 is given. During the program operation to the memory cell MC, the second column transistor control signal BS0 is in a selected state.

The second column transistor B1 is connected to a drain voltage application transistor T1, while the second column transistor B0 is connected to a ground voltage application transistor T0. During the program operation, the drain voltage application transistor T1 applies a positive high voltage VPPD to the drain of the memory cell MC, while the ground voltage application transistor T0 applies a ground voltage of 0 V to the source of the memory cell MC.

That is, during the program operation, the positive high voltage VPPD is applied to the drain of the memory cell MC via the drain voltage application transistor T1, the second column transistor B1, the first column transistor C1, the main bit line MBL1, the selection transistor S1, and the sub-bit line SBL1. On the other hand, the ground voltage of 0 V is applied to the source of the memory cell MC via the ground voltage application transistor T0, the second column transistor B0, the first column transistor C0, the main bit line MBL0, the selection transistor S0, and the sub-bit line SBL0.

SUMMARY

However, the conventional semiconductor memory device described above has the following problem.

That is, since the program operation in the MONOS flash memory is performed through the CHE (Channel Hot Electron) operation, a memory cell current as large as about 100 to 200 µA flows. As a result, in an actual situation, the ground voltage applied to the source of the memory cell rises from the original ground voltage due to IR-DROP in a current path from the ground to the source of the memory cell MC.

This phenomenon will be described more specifically with reference to FIG. 8. The ground voltage applied to the source of the memory cell MC is actually applied via the ground voltage application transistor T0, the second column transistor B0, the first column transistor C0, the main bit line MBL0, the selection transistor S0, and the sub-bit line SBL0. In this current path, the memory cell current as large as about 100 to 200 µA flows so that a voltage of, e.g., about 200 to 300 mV is actually applied to the source of the memory cell MC.

As a flash memory becomes increasingly larger in capacity and smaller in size, the size of a transistor forming the current path mentioned above tends to be smaller in future. In the structure of FIG. 8, the column transistors are in a 2-stage configuration including the first column transistor C0 and the second column transistor B0. However, as a flash memory becomes increasingly larger in capacity and smaller in size, the number of stages of column transistors tends to increase from 2 to 3 or 4 to provide a more-multi-stage configuration. That is, as a flash memory becomes increasingly larger in capacity and smaller in size, a voltage (which is originally the ground voltage) actually applied to the source of a memory cell during a program operation tends to rise.

The rise in the voltage applied to the source of the memory cell is not preferred. For example, to perform a program operation, a predetermined voltage needs to be applied between the drain and source of the memory cell, but the rise in source voltage entails the need to increase a drain voltage required for the program operation. The drain voltage is generated/supplied by a charge pump circuit and a regulator circuit in a chip. Accordingly, to generate a high drain voltage, the area occupied by the charge pump circuit and the regulator circuit needs to be increased to consequently increase a chip area.

Additionally, in terms of the device reliability of a MONOS flash memory, a source voltage during a program operation preferably has a value close to the ground voltage.

To suppress the source voltage rise due to the IR-DROP during the program operation, a method is considered which increases the size of a transistor in the current path. However, the method is not preferable because it causes an increase in chip area. Besides, a method is also considered which increases the gate voltage of the transistor in the current path. However, the method is not preferable, either, because it causes an increase in the area occupied by the charge pump circuit and the regulator circuit.

In view of the problems mentioned above, it is therefore an object of the present invention to suppress, in a semiconductor memory device, a voltage rise due to IR-DROP which occurs when a ground voltage is applied to a memory cell during a program operation.

A semiconductor memory device according to the present invention includes: a memory cell; first and second bit lines connected respectively to a source and a drain of the memory cell either directly or indirectly each via a selection transistor; a voltage application circuit for outputting a ground voltage and a predetermined positive voltage each to be applied to the memory cell; a column selection circuit for controlling whether or not the ground voltage and the predetermined positive voltage each outputted from the voltage application circuit are to be applied to the first and second bit lines; first and second discharge transistors provided respectively between the first and second bit lines and a ground to receive mutually independent discharge control signals at respective gates thereof; and a discharge control circuit for generating and outputting the discharge control signals.

In the semiconductor memory device according to the present invention, the first and second discharge transistors are provided between the ground and the first and second bit lines connected respectively to the source and drain of the memory cell. The first and second discharge transistors receive the mutually independent discharge control signals which are generated and outputted by the discharge control circuit at the respective gates thereof. In such a structure, the first and second discharge transistors are activated respectively for the first and second bit lines to allow the application of the ground voltage. As a result, using the discharge transistor, the ground voltage can be set to the bit line which applies the ground voltage to the memory cell. Therefore, it becomes possible to suppress a rise in ground voltage due to IR-DROP.

In the semiconductor memory device according to the present invention, it is preferable that the column selection circuit applies the ground voltage to the first bit line, and applies the predetermined positive voltage to the second bit line, and the discharge control circuit generates and outputs the discharge control signals so as to activate the first discharge transistor, and inactivate the second discharge transistor.

In the semiconductor memory device according to the present invention, it is also preferable that the column selection circuit applies no voltage to the first bit line, and applies the predetermined positive voltage to the second bit line, and the discharge control circuit generates and outputs the discharge control signals so as to activate the first discharge transistor, and inactivate the second discharge transistor.

Thus, according to the present invention, it becomes possible to suppress the voltage rise due to the IR-DROP which occurs when the ground voltage is applied to the memory cell during the program operation. This allows a low-voltage write operation as well as a reduction in chip area.

BRIEF DESCRIPTION OF THE DRAWINGS

FIG. 3 is a view showing a cross section of the memory cell array in the semiconductor memory device according to the embodiment;

FIG. 4A is a view showing a cross-sectional structure of a memory cell in the semiconductor memory device according to the embodiment, and FIG. 4B is a view showing an applied voltage and a cell current in each operation;

DETAILED DESCRIPTION

Figure 1:
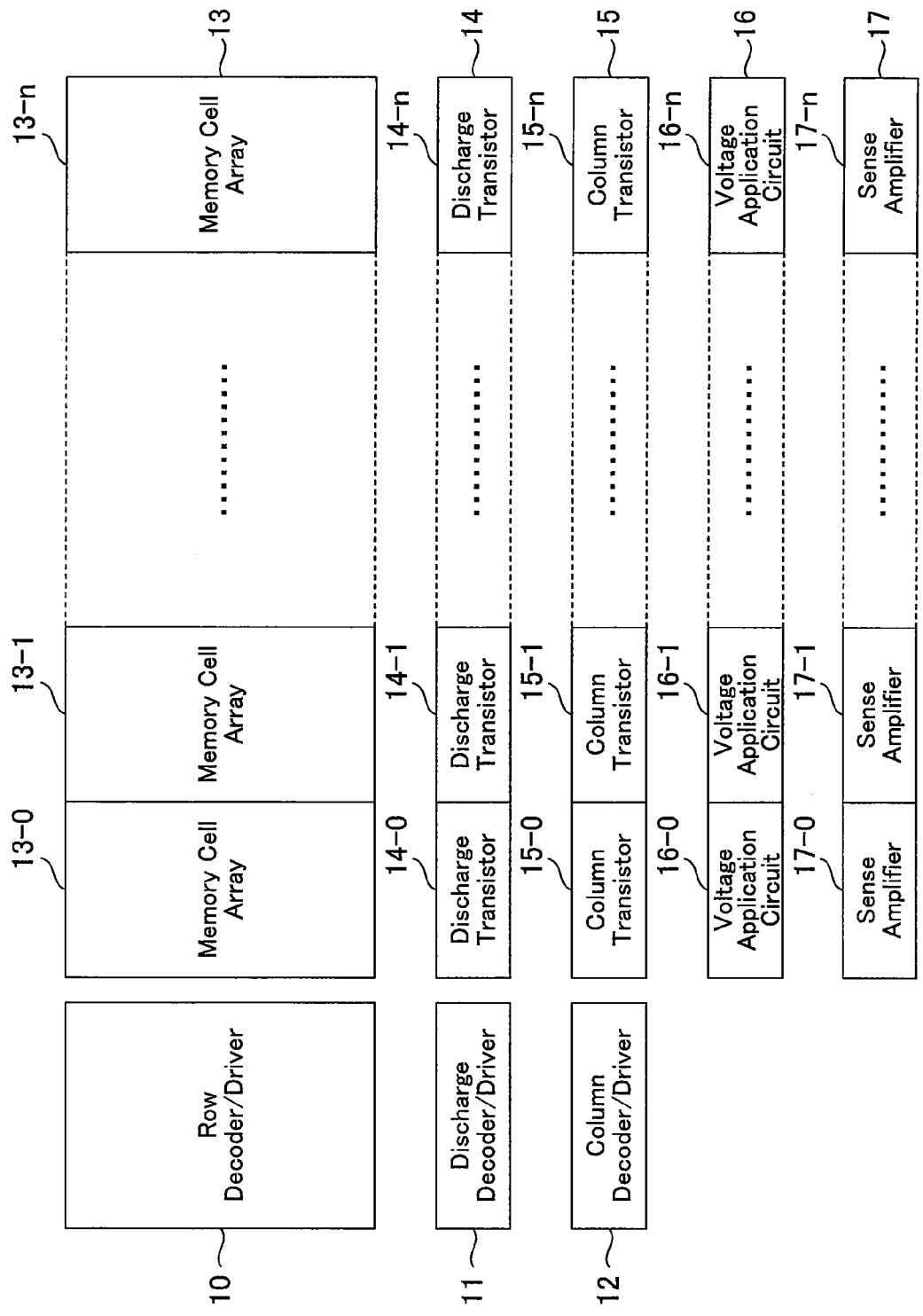
FIG. 1 is a view showing a structure of a semiconductor memory device according to an embodiment.

FIG. 1 is a view showing a structure of a semiconductor memory device according to an embodiment. The semiconductor memory device of FIG. 1 includes a row decoder/driver 10, a discharge decoder/driver 11, a column decoder/driver 12, a memory cell array 13, a discharge transistor 14, a column transistor 15, a voltage application circuit 16, and a sense amplifier 17.

The row decoder/driver 10 is a circuit which receives an input address (not shown in FIG. 1), and selectively drives a word line in the memory cell array 13. The discharge decoder/driver 11 is a circuit which receives the input address, and selectively drives the discharge transistor 14. The column decoder/driver 12 is a circuit which receives the input address, and selectively drives the column transistor 15.

In the memory cell array 13, memory cells for storing data are arranged in a matrix. The discharge transistor 14 is a circuit disposed for each bit line in a one-to-one correspondence to set the bit line to a ground voltage. The column transistor 15 is a circuit disposed for each bit line in a one-to-one correspondence to select the predetermined one from among a plurality of bit lines, and connect the selected bit line to the voltage application circuit 16 and the sense amplifier 17.

The voltage application circuit 16 applies a predetermined voltage to a memory cell. Specifically, in a read operation, a program operation, and an erase operation, the voltage application circuit 16 applies a positive voltage or the ground voltage to the drain terminal and source terminal of the memory cell. The voltage supplied from the voltage application circuit 16 is applied to the bit line selected by the column transistor 15.

The sense amplifier 17 is a circuit which determines data stored in the memory cell array 13. Specifically, during a read operation, the bit line selected by the column transistor 15 is connected to the sense amplifier 17, and the sense amplifier 17 determines data in a memory cell.

As the memory cell array 13, the discharge transistor 14, the column transistor 15, the voltage application circuit 16, and the sense amplifier 17, identical circuits are used for each sense amplifier. In, e.g., FIG. 1, the sense amplifier 17 includes (N+1) sense amplifier circuits 17-0 to 17-n, and circuits connected to the sense amplifier 17-0 are a voltage application circuit 16-0, a column transistor 15-0, a discharge transistor 14-0, and a memory cell array 13-0. Likewise, circuits connected to the sense amplifier 17-1 are a voltage application circuit 16-1, a column transistor 15-1, a discharge transistor 14-1, and a memory cell array 13-1 which are identical to the circuits connected to the sense amplifier 17-0.

Hereinbelow, a description will be given by taking the components connected to the sense amplifier 17-0 as an example.

Figure 2:
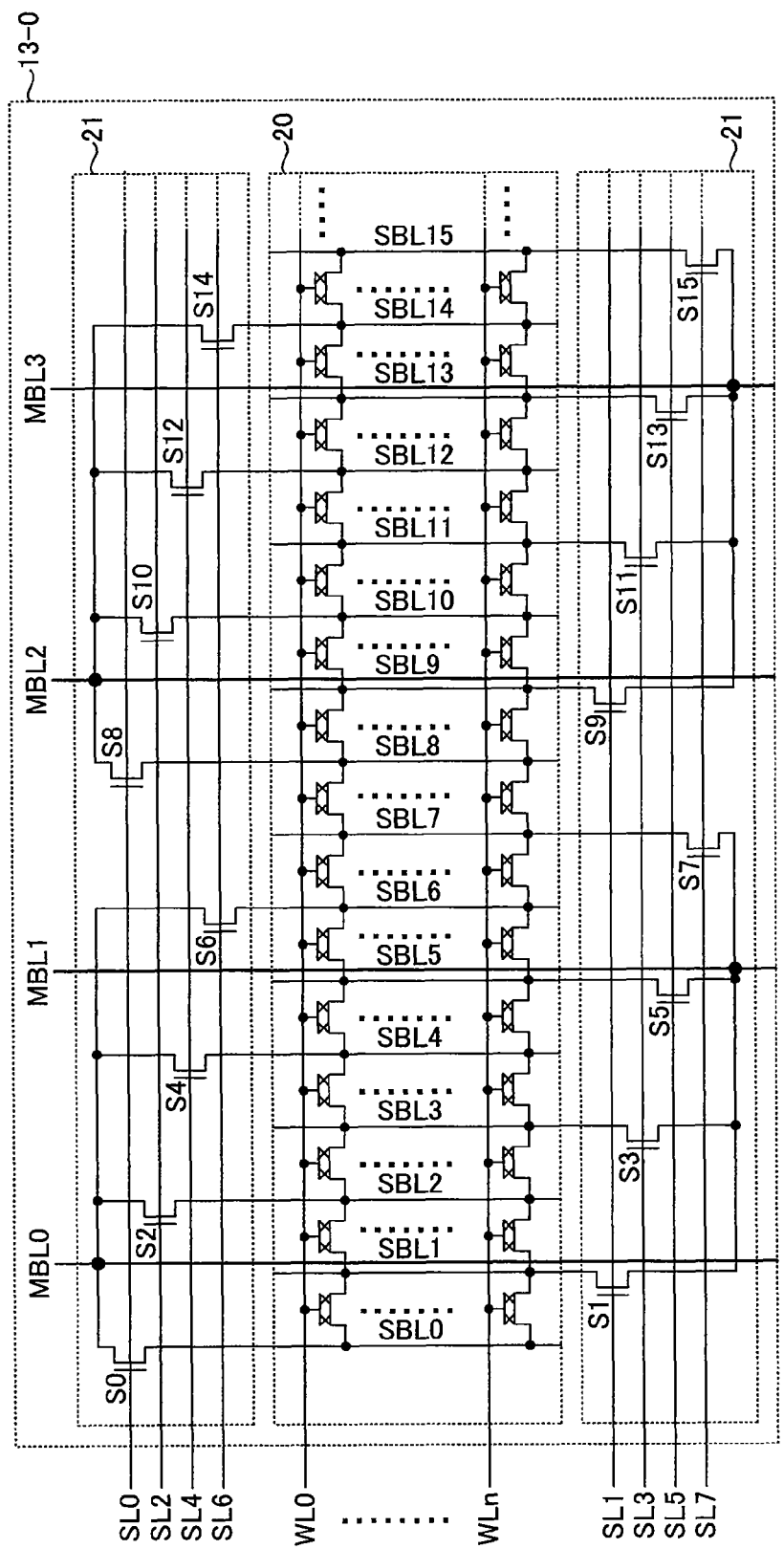
FIG. 2 is a view showing a structure of a memory cell array in the semiconductor memory device according to the embodiment.

FIG. 2 is a view showing a structure of the memory array in the semiconductor memory device according to the present embodiment.

The memory cell array 13-0 includes a memory cell region 20 and a selection transistor region 21. The memory cell region 20 is a memory cell array having a virtually grounded configuration. The memory cell region 20 includes a plurality of word lines WL0 to WLn and a plurality of sub-bit lines SBL0 to SBL15 (only some of the sub-bit lines are shown). The sub-bit lines SBL0 to SBL15 are connected respectively to selection transistors S0 to S15 in the selection transistor region 21. To the respective gate terminals of the selection transistors S0 to S15, selection transistor control signals SL0 to SL7 are given.

The sub-bit lines SBL0 to SBL15 are connected to main bit lines MBL0 to MBL3 via selection transistors S0 to S15. For example, the main bit line MBL0 is connected to the sub-bit lines SBL0, SBL2, SBL4, and SBL6 via the selection transistors S0, S2, S4, and S6. This shows a configuration in which the four sub-bit lines are connected to the one main bit line via the four selection transistors. The similar circuit structure is provided for each of the main bit lines MBL1 to MBL3 so that a detailed description thereof is omitted.

FIG. 3 is a view showing a cross section of the memory cell array in the semiconductor memory device according to the present embodiment. FIG. 3 is a view showing the cross section in a word line direction, in which three memory cells 0 to 2 are shown.

In a semiconductor substrate 30, diffusion regions 31a to 31d are formed to operate as diffusion bit lines. The regions between the diffusion bit lines operate as the channel regions of the memory cells, on which an ONO film 36 having an ONO (Oxide-Nitride-Oxide) structure including an oxide film 32, a nitride film 33, and an oxide film 34 is formed. Data in the memory cells are stored in the ONO film 36. On the ONO film 36, word lines 35 made of polysilicon are formed. The memory cell 0 uses the diffusion bit lines 31a and 31b as the source terminal and drain terminal thereof. The memory cell 1 uses the diffusion bit lines 31b and 31c as the source terminal and drain terminal thereof. The memory cell 2 uses the diffusion bit lines 31c and 31d as the source terminal and drain terminal thereof.

FIGS. 4A and 4B are views showing a cross-sectional structure of the memory cell and the values of applied voltages in the semiconductor memory device according to the present embodiment, of which FIG. 4A is a cross-sectional view in a word line direction, and shows the cross-sectional structure of the memory cell 0 in FIG. 3. In FIG. 4A, the components common to those shown in FIG. 3 are designated by the same reference numerals, and the description thereof is omitted herein. As shown in FIG. 4A, the memory cell stores data at two physically different locations A and B in the ONO film 36.

FIG. 4B is a view showing the values of applied voltages and the values of cell currents flowing in the memory cell in a read operation (READ mode) and a program operation (PROGRAM mode).

As shown in FIG. 4B, the operation of reading data stored at the location A is performed by respectively applying a voltage of about 5 V, a positive voltage of 1.5 V, and a ground voltage of 0 V to a gate 35, the diffusion bit line (drain) 31a, and the diffusion bit line (source) 31b. When the data stored at the location A is erase data (having a low threshold voltage), a current flows in the memory cell. On the other hand, when the data stored at the location A is program data (having a high threshold voltage), a current does not flow in the memory cell. A cell current in a reference cell during the read operation is about 10 to 20 μA.

A program operation to the data stored at the location A is performed by respectively applying a voltage of about 9 V, a positive high voltage of 3 to 6 V, and the ground voltage of 0 V to the gate 35, the drain 31b, and the source 31a. Since the program operation is performed through the CHE (Channel Hot Electron) in a MONOS flash memory, the memory cell current flowing at this time has values as large as 100 to 200 μA.

On the other hand, in the read operation and the program operation to data stored at the location B, the voltage applied to the gate 35 is the same as that applied in the read operation and the program operation to the data stored at the location A, but the voltages applied to the drain 31a and the source 31b are switched. That is, in the read operation, a positive value of 1.5 V and the ground voltage of 0V are applied respectively to the drain 31b and the source 31a while, in the program operation, a positive high voltage of 3 to 6 V and the ground voltage of 0 V are applied respectively to the drain 31a and the source 31b.

Figure 5:
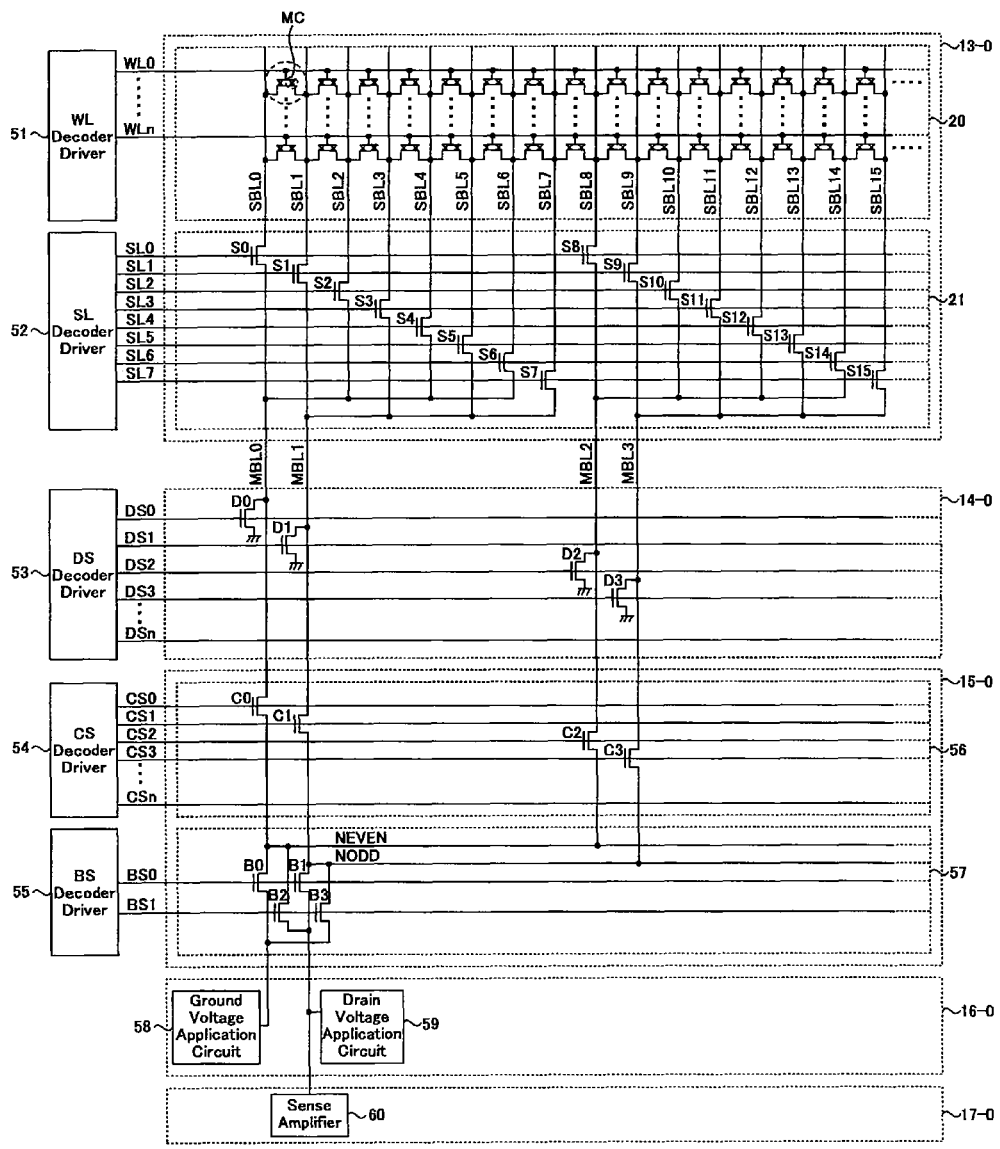
FIG. 5 is a view showing a structure of the semiconductor memory device according to the embodiment.

FIG. 5 is a view showing the structure of the semiconductor memory device according to the present embodiment. FIG. 5 shows a more detailed circuit structure of the row decoder/driver 10, the discharge decoder/driver 11, the column decoder/driver 12, the sense amplifier 17-0, the voltage application circuit 16-0, the column transistor 15-0, the discharge transistor 14-0, and the memory cell array 13-0 in the semiconductor memory device of FIG. 1.

In FIG. 5, a WL decoder driver 51 is a circuit which corresponds to the row decoder/driver 10 in FIG. 1, and selectively drives the word lines WL0 to WLn in the memory cell region 20 of the memory cell array 13-0. An SL decoder driver 52 is a circuit which corresponds to the column decoder/driver 12 in FIG. 1, and selectively drives the selection transistor control signals SL0 to SL7 in the selection transistor region 21 of the memory cell array 13-0.

A DS decoder driver 53 is a circuit and which corresponds to the discharge decoder/driver 11 in FIG. 1, and selectively drives discharge control signals DS0 to DSn to the discharge transistor 14-0.

A CS decoder driver 54 is a circuit which corresponds to the column decoder/driver 12 in FIG. 1, and selectively drives CS transistor control signals CS0 to CSn to a CS transistor 56 in the column transistor 15-0. The BS decoder driver 55 is a circuit which corresponds to the column decoder/driver 12 in FIG. 1, and selectively drives BS transistor control signals BS0 and BS1 to a BS transistor 57 in the column transistor 15-0.

The structure of the memory cell array 13-0 is the same as in FIG. 2 so that a detailed description thereof is omitted. However, in the memory array 13-0 of FIG. 5, the memory cell region 20 is disposed in an upper portion, while the selection transistor region 21 is disposed in a lower portion, for clear understanding of the connection relation between the memory cell region 20 and the selection transistor region 21. In an actual layout, however, the selection transistor region 21 is mostly disposed in each of the portions located over and under the memory cell region 20, as shown in FIG. 2. The sub-bit lines SBL0 to SBL15 in the memory cell region 20 are connected to the main bit lines MBL0 to MBL 3 via the selection transistors S0 to S15.

The discharge transistor 14-0 includes discharge transistors D0 to Dn (of which only the discharge transistors D0 to D3 are shown in the drawing) arranged for the respective main bit lines in a one-to-one correspondence. The discharge transistors D0 to Dn are each provided between the main bit lines and the ground to receive the mutually independent discharge control signals DS0 to DSn at the respective gates thereof. That is, the respective gates of the discharge transistors D0, D1, D2, and D3 respectively receive the discharge control signals DS0, DS1, DS2, and DS3.

The semiconductor memory device according to the present embodiment is characterized in that the discharge transistors D0 to Dn are disposed for the individual main bit lines in a one-to-one correspondence, and the mutually independent discharge control signals DS0 to DSn are given to the respective gates thereof to allow independent control of the respective activated/inactivated states of the discharge transistors D0 to Dn. The semiconductor memory device according to the present embodiment is also characterized by a decode operation of the DS decoder driver 53 which selectively drives the discharge control signals DS0 to DSn, which will be described later.

The column transistor 15-0 is a circuit for connecting/disconnecting the main bit lines MBL0 to MBL3 to and from the voltage application circuit 16-0 and the sense amplifier 17-0, which will be described later. The column transistor 15-0 according to the present embodiment has a 2-stage configuration, and includes the CS transistor region 56 and the BS transistor region 57.

The CS transistor region 56 includes CS transistors C0 to Cn (of which only the CS transistors C0 to C3 are shown in the drawing) which are provided for the individual main bit lines in a one-to-one correspondence, and the CS transistor control signals CS0 to CSn are given to the respective gates thereof. The other ends of the CS transistors C0 to Cn are connected to a node NEVEN or a node NODD. That is, the even-numbered CS transistors C0 and C2 are each connected to the node NEVEN, while the odd-numbered CS transistors C1 and C3 are each connected to the node NODD.

The BS transistor region 57 includes BS transistors B0 to B3, and the BS transistor control signal BS0 or BS1 is given to the respective gates thereof. That is, the BS transistor control signal BS0 is given to the respective gates of the BS transistors B0 and B1, while the BS transistor control signal BS1 is given to the respective gates of the BS transistors B2 and B3. When the BS transistor control signal BS0 is selected, the BS transistors B0 and B1 are each brought into a selected state so that the node NEVEN is connected to the ground voltage application circuit 58, and the node NODD is connected to a drain voltage application circuit 59 and a sense amplifier 60. On the other hand, when the BS transistor control signal BS1 is selected, the BS transistors B2 and B3 are each brought into a selected state so that the node NEVEN is connected to the drain voltage application circuit 59 and the sense amplifier 60, while the node NODD is connected to the ground voltage application circuit 58.

The CS decoder driver 54, the BS decoder driver 55, and the column transistor 15-0 constitute a column selection circuit.

The voltage application circuit 16-0 generates/supplies a drain voltage and a ground voltage to be applied to the memory cell, and includes a ground voltage application circuit 58 and a drain voltage application circuit 59. The ground voltage application circuit 58 applies a ground voltage of 0 V to the memory cell. The drain voltage application circuit 59 applies a drain voltage to the memory cell. The drain voltage application circuit 59 applies a drain voltage of about 1.5 V during a read operation, and applies a drain voltage of about 3 to 6 V during a program/erase operation.

The sense amplifier 17-0 is a circuit which detects/amplifies the potential of a bit line during a read operation to determine data stored in the memory cell region 20.

A description will be given to the program operation in the semiconductor memory device thus constructed according to the present embodiment. The description will be given herein by taking as an example the case where the program operation is performed to the memory cell MC in the memory cell region 20 of FIG. 5 which is connected to the word line WL0, and has the sub-bit line SBL0 and SLB1 as the drain and source thereof.

Figure 6:
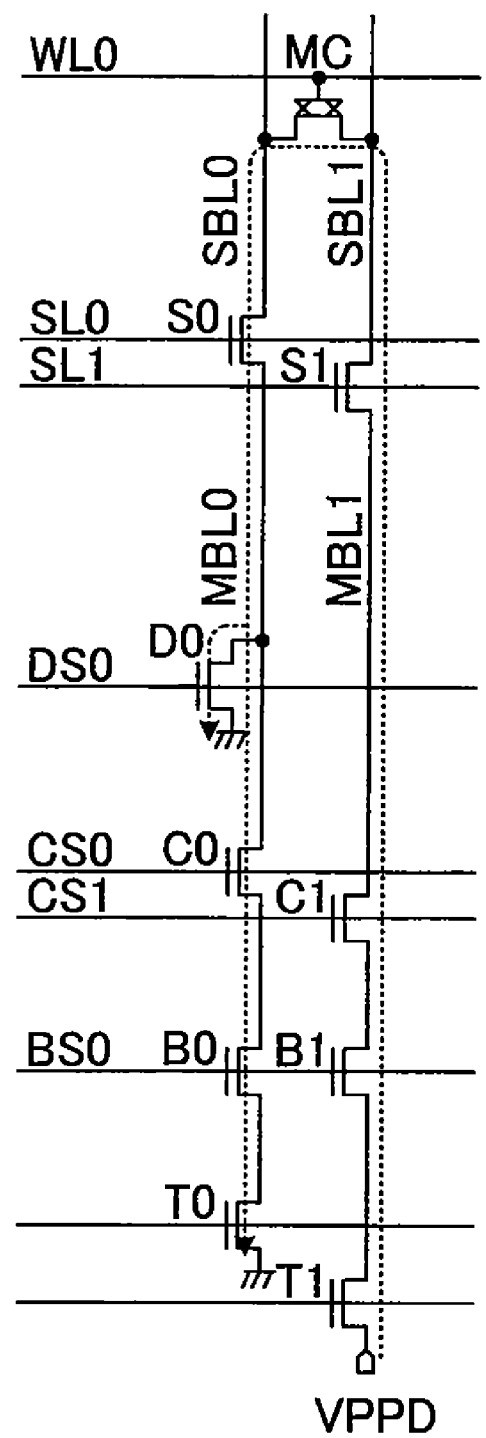
FIG. 6 is a view showing a current path during a program operation in the semiconductor memory device according to the embodiment.

FIG. 6 is a view selectively showing a structure of the semiconductor memory device according to the present embodiment which is related to the memory cell MC, and showing a current path during the program operation in the present embodiment. The program operation to the memory cell MC is performed by applying a positive high voltage of about 9 V to the word line WL0, applying a positive high voltage of about 3 to 6 V to the sub-bit line SBL1, and applying a ground voltage of 0 V to the sub-bit line SBL0.

To perform the program operation to the memory cell MC, the WL decoder driver 51 selects the word line WL0, and applies a voltage of about 9 V thereto. The SL decoder driver 52 selects the selection transistor control signals SL0 and SL1, and applies a voltage of about 10 V. As a result, the sub-bit lines SBL0 and SBL1 are connected respectively to the main bit lines MBL0 and MBL1 via the selection transistors S0 and S1.

To activate the first discharge transistor D0 connected as a first bit line to the main bit line MBL0 (to which the ground voltage of 0 V is applied during the program operation), the DS decoder driver 53 as a discharge control circuit selectively drives the discharge control signal DS0. As a result, the main bit line MBL0 is set to the ground voltage of 0 V via the discharge transistor D0. At this time, since the discharge control signal DS1 in a non-selected state, the second discharge transistor D1 connected as a second bit line to the main bit line MBL1 (to which the positive high voltage of about 3 to 6 V is applied during the program operation) is in an inactivated state. This is for preventing a short-circuit between the main bit line MBL1 to which the positive high voltage of about 3 to 6 V is applied and the ground, which would be caused when the discharge transistor D1 is activated.

That is, in the semiconductor memory device according to the present embodiment, the DS decoder driver 53 as the discharge control circuit generates and outputs the mutually independent discharge control signals DS0 to DSn to allow independent control of the respective activated/inactivated states of the discharge transistors D0 to Dn. Therefore, during the program operation, it is possible to activate the discharge transistor D0 connected to the main bit line MBL0 to which the ground voltage is applied, and inactivate the discharge transistor D1 connected to the main bit line MBL1 to which the positive high voltage of about 3 to 6 V is applied. As a result, only the main bit line MBL0 to which the ground voltage is applied during the program operation is set to the ground voltage of 0 V via the discharge transistor D0.

The CS decoder driver 54 selects the CS transistor control signals CS0 and CS1, and applies a voltage of about 10 V. As a result, the main bit line MBL0 is connected to the node NEVEN, while the main bit line MBL1 is connected to the node NODD.

The BS decoder driver 55 selects the BS transistor control signal BS0, and applies a voltage of about 10 V. As a result, the node NEVEN is connected to the ground voltage application circuit 58, while the node NODD is connected to the drain voltage application circuit 59 and the sense amplifier 60. In FIG. 6, the ground voltage application circuit 58 is made of a transistor T0, while the drain voltage application circuit 59 is made of a transistor T1.

In this manner, a positive high voltage VPPD of about 3 to 6 V is applied to the main bit line MBL1 via the drain voltage application circuit T1, the BS transistor B1, and the CS transistor C1, and further applied to the sub-bit line SBL1 via the selection transistor S1. Additionally, the ground voltage of 0 V is applied to the main bit line MBL0 via the ground voltage application circuit T0, the BS transistor B0, and the CS transistor C0, applied to the main bit line MBL0 via the discharge transistor D0, and further applied to the sub-bit line SBL0 via the selection transistor S0. As a result, the positive high voltage of about 3 to 6 V is applied to the drain of the memory cell MC, while the ground voltage of 0 V is applied to the source thereof.

In this case, as indicated by the dotted line in FIG. 6, a memory cell current of about 100 to 200 μA flowing during the program operation flows from a VPPD terminal for supplying the voltage to the drain voltage application circuit T1 to the discharge transistor D0 and the ground voltage application circuit T0 via the memory cell MC.

Figure 8:
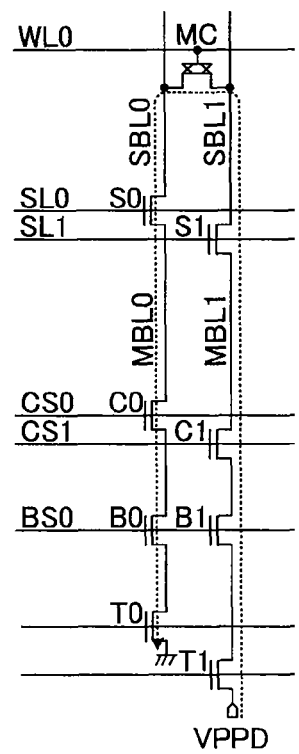
FIG. 8 is a view showing a current path during a program operation in a conventional semiconductor memory device.

In the conventional semiconductor memory device, as shown in FIG. 8, the memory cell current flows from the VPPD terminal for supplying the voltage to the drain voltage application circuit T1 only to the ground voltage application circuit T0 via the memory cell MC. By contrast, in the present embodiment, the memory cell current flows not only to the ground voltage application circuit T0, but also to the discharge transistor D0. That is, according to the present embodiment, the memory cell current of about 100 to 200 μA splits into two branches to flow to the ground. Accordingly, the IR-DROP in the current path when the memory cell current flows is smaller than in the conventional semiconductor memory device. In particular, the IR-DROP in the current path through the ground voltage application circuit T0, the BS transistor B0, and the CS transistor C0 is smaller. Therefore, it is possible to suppress a voltage rise due to the IR-DROP in the current path of the memory cell current which occurs when the ground voltage is applied to the source of the memory cell MC.

Figure 7:
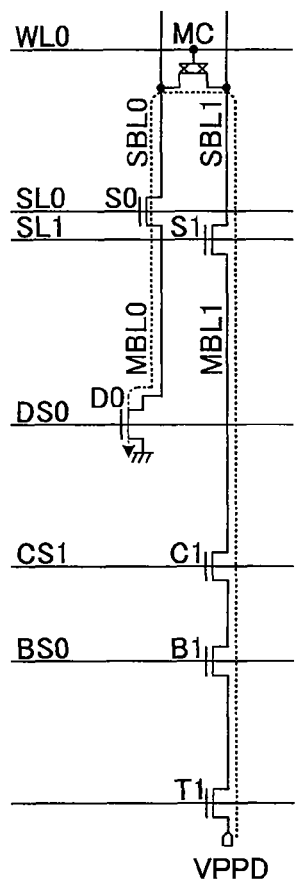
FIG. 7 is a view showing a current path during a program operation in a semiconductor memory device according to another embodiment.

FIG. 7 is a view selectively showing a structure of the semiconductor memory device according to the present embodiment which is related to the memory cell MC, and showing a current path during a program operation in another embodiment. The structure of FIG. 7 is substantially the same as that of FIG. 6 so that a description will be given only to points different than in FIG. 6.

The structure of FIG. 7 is different from that of FIG. 6 in the CS transistor control signal selected by the CS decoder driver 54. That is, in the structure of FIG. 6, the CS transistor control signals CS0 and CS1 are electively driven to activate the CS transistors C0 and C1. In the structure of FIG. 7, however, the CS decoder driver 54 selectively drives only the CS transistor control signal CS1 to activate only the CS transistor C1 connected to the drain of the memory cell MC.

As a result, the positive high voltage VPPD of about 3 to 6 V is applied to the main bit line MBL1 via the drain voltage application circuit T1, the BS transistor B1, and the CS transistor C1, and further applied to the sub-bit line SBL1 via the selection transistor S1. On the other hand, the ground voltage of 0 V is applied to the main bit line MBL0 via the discharge transistor D0, and further applied to the sub-bit line SBL0 via the selection transistor S0. As a result, the positive high voltage of about 3 to 6 V is applied to the drain of the memory cell MC, while the ground voltage of 0 V is applied to the source thereof.

In this case, as indicated by the dotted line in FIG. 7, the memory cell current of about 100 to 200 μA flowing during the program operation flows from the VPPD terminal for supplying the voltage to the drain voltage application circuit T1 only to the discharge transistor D0 via the memory cell MC. The memory cell current does not flow to the ground voltage application circuit T0.

The amount of an IR-DROP rise which occurs when the ground voltage is applied to the memory cell MC is larger in the structure of FIG. 7 than in the structure of FIG. 6, but smaller than in the prior-art structure shown in FIG. 8. This is because, in contrast to the structure of FIG. 8 in which the ground voltage of 0 V is applied to the main bit line MBL0 via the ground voltage application transistor T0, the BS transistor B0, and the CS transistor C0, the ground voltage of 0 V is applied directly to the main bit line MBL0 via the discharge transistor D0 in the other embodiment shown in FIG. 7.

Thus, according to another embodiment shown in FIG. 7, the amount of the IR-DROP rise which occurs when the ground voltage is applied to the memory cell can be reduced to a value smaller than that achieved with the prior-art technology. The amount of the IR-DROP rise which occurs when the ground voltage is applied to the memory cell is larger than in the embodiment shown in FIG. 6, but the number of the CS transistor control signals to be selectively driven is smaller by one. Since the number of the column transistor control signals to be driven is reduced, it is possible to reduce a current consumed by driving the column transistors. Since the column transistors are driven with the positive high voltage during the program operation, the reduction in the number of the column transistor control signals to be driven allows a reduction in the area occupied by the charge pump circuit and the regulator circuit which generate/supply the positive high voltage.

Thus, in the semiconductor memory device according to the present embodiment, the discharge transistors are provided for the individual main bit lines in a one-to-one correspondence, and the mutually independent discharge control signals are given to the respective gates of the discharge transistors. Accordingly, during the program operation, only the discharge transistors provided in the main bit lines to which the ground voltage is applied can be activated. As a result, it becomes possible to reduce a rise in the ground voltage applied to the source of the memory cell due to the IR-DROP in the current path of the memory cell current. This allows a reduction in the positive high voltage applied to the drain of the memory cell to allow a low-voltage write operation as well as a reduction in the area occupied by the charge pump circuit and the regulator circuit which generate/supply the positive high voltage.

Since the source of the memory cell during the program operation can be set to a value close to the ground voltage, the device reliability of the MONOS flash memory can be improved.

Since the discharge transistor is used to set the source of the memory cell to the ground voltage, the transistor size of the column transistor can be reduced to allow a reduction in chip area.

Additionally, in the structure of FIG. 7, the column transistor of the main bit line connected to the source of the memory cell is brought into the non-selected state to prevent voltage application, and the ground voltage is supplied only from the discharge transistor. As a result, the number of the column transistor control signals can be reduced to allow a reduction in the current consumed by driving the column transistor. Therefore, it is possible to reduce the area occupied by the charge pump circuits and the regulator circuit which generate/supply the positive high voltage.

In each of the embodiments described above, the description has been given by way of example during the program operation. However, the present invention may also be practiced during an operation other than the program operation such as, e.g., a read operation.

In each of the embodiments described above, the DS decoder driver 53 preferably activates both of the discharge transistors D0 and D1 after the program operation is completed.

In each of the embodiments described above, the DS decoder driver 53 preferably activates both of the discharge transistors D0 and D1 after the read operation is completed.

Although the embodiments of the present invention have been described heretofore, the semiconductor memory device according to the present invention is not limited to the illustrative embodiments described above. The present invention is also effective with a semiconductor memory device obtained by making various modifications and changes to the present invention without departing from the gist thereof.

For example, the semiconductor memory device according to each of the foregoing embodiments has been described using the MONOS flash memory as an example. However, the present invention is also applicable to a semiconductor memory device other than the flash memory, such as a mask ROM.

Although the semiconductor memory device according to each of the embodiments described above has been assumed to have a hierarchical bit-line structure including the main bit lines and the sub-bit lines, the present invention is also applicable to a semiconductor memory device including a memory cell array which does not have the hierarchical bit-line structure. For example, the discharge transistors may also be provided in the main bit lines which are connected via the selection transistors to the sub-bit lines connected to the source and drain of the memory cell, or may be provided in the bit lines which are connected directly to the source and drain of the memory cell.

Although the semiconductor memory device according to each of the embodiments described above is an example including the memory cell array having the virtually grounded structure, the present invention is also applicable to a semiconductor memory device including a memory cell array having a NOR structure, a DINOR structure, a NAND structure, or an AND structure.

Since the semiconductor memory device according to the present invention allows the suppression of a voltage rise due to the IR-DROP which occurs when the ground voltage is applied to the memory cell during the program operation, it is possible to implement a low-voltage write operation and a reduced chip area. Therefore, the semiconductor memory device according to the present invention is useful in implementing a flash memory having lower power consumption and a smaller size or the like.

The invention claimed is:

1. A semiconductor memory device comprising:
   a memory cell;
   first and second bit lines connected respectively to a source and a drain of the memory cell either directly or indirectly via a selection transistor;
   a voltage application circuit for outputting a ground voltage and a predetermined positive voltage each to be applied to the memory cell;
   a column selection circuit for controlling whether or not the ground voltage and the predetermined positive voltage outputted from the voltage application circuit are to be applied to the first and second bit lines;
   first and second discharge transistors provided respectively between the first and second bit lines and a ground to receive mutually independent discharge control signals at respective gates thereof; and
   a discharge control circuit for generating and outputting the discharge control signals.

2. The semiconductor memory device of claim 1, wherein the column selection circuit applies the ground voltage to the first bit line, and applies the predetermined positive voltage to the second bit line, and
   the discharge control circuit generates and outputs the discharge control signals so as to activate the first discharge transistor, and inactivate the second discharge transistor.

3. The semiconductor memory device of claim 1, wherein the column selection circuit applies no voltage to the first bit line, and applies the predetermined positive voltage to the second bit line, and
   the discharge control circuit generates and outputs the discharge control signals so as to activate the first discharge transistor, and inactivate the second discharge transistor.

4. The semiconductor memory device of claim 1, wherein, after a program operation is completed, the discharge control circuit activates both of the first and second discharge transistors.

5. The semiconductor memory device of claim 1, wherein, after a read operation is completed, the discharge control circuit activates both of the first and second discharge transistors.

6. The semiconductor memory device of claim 1, wherein the first and second bit lines are main bit lines which are connected each via a selection transistor to sub-bit lines connected to the source and drain of the memory cell.

* * * * *